US009361991B1

(12) United States Patent
Ng et al.

(10) Patent No.: US 9,361,991 B1
(45) Date of Patent: Jun. 7, 2016

(54) EFFICIENT SCANNING OF NONVOLATILE MEMORY BLOCKS

(71) Applicant: SanDisk Technologies, Inc., Plano, TX (US)

(72) Inventors: Yew Yin Ng, Milpitas, CA (US); Gautam Dusija, Milpitas, CA (US); Dennis S. Ea, Hayward, CA (US); Mrinal Kochar, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/581,748

(22) Filed: Dec. 23, 2014

(51) Int. Cl.
G11C 16/04 (2006.01)
G11C 16/26 (2006.01)
G11C 11/56 (2006.01)

(52) U.S. Cl.
CPC ............ G11C 16/26 (2013.01); G11C 11/5628 (2013.01)

(58) Field of Classification Search
CPC .. G11C 15/046; G11C 2213/75; G11C 16/08; G11C 11/5628
See application file for complete search history.

(56) References Cited

U.S. PATENT DOCUMENTS

| 2002/0031038 | A1* | 3/2002 | Honda | G11C 8/12 365/230.03 |
| 2009/0067241 | A1* | 3/2009 | Gorobets | G06F 11/1441 365/185.04 |
| 2009/0070521 | A1 | 3/2009 | Gorobets et al. | |
| 2009/0070529 | A1 | 3/2009 | Mee et al. | |
| 2009/0070748 | A1 | 3/2009 | Lin et al. | |
| 2010/0172180 | A1* | 7/2010 | Paley | G11C 11/5628 365/185.12 |
| 2013/0219107 | A1 | 8/2013 | Lee et al. | |
| 2014/0153333 | A1* | 6/2014 | Avila | G11C 16/3445 365/185.11 |

* cited by examiner

Primary Examiner — Tuan T Nguyen
(74) Attorney, Agent, or Firm — Davis Wright Tremaine LLP

(57) ABSTRACT

A method of searching for a boundary between a written portion and an unwritten portion of an open block may include performing a word line by word line binary search of a first physical area of the open block to identify a last written word line of the first physical area of the block, and subsequently, searching in at least a second physical area of the open block based on the last written word line of the first physical area of the block as identified by the binary search.

20 Claims, 15 Drawing Sheets

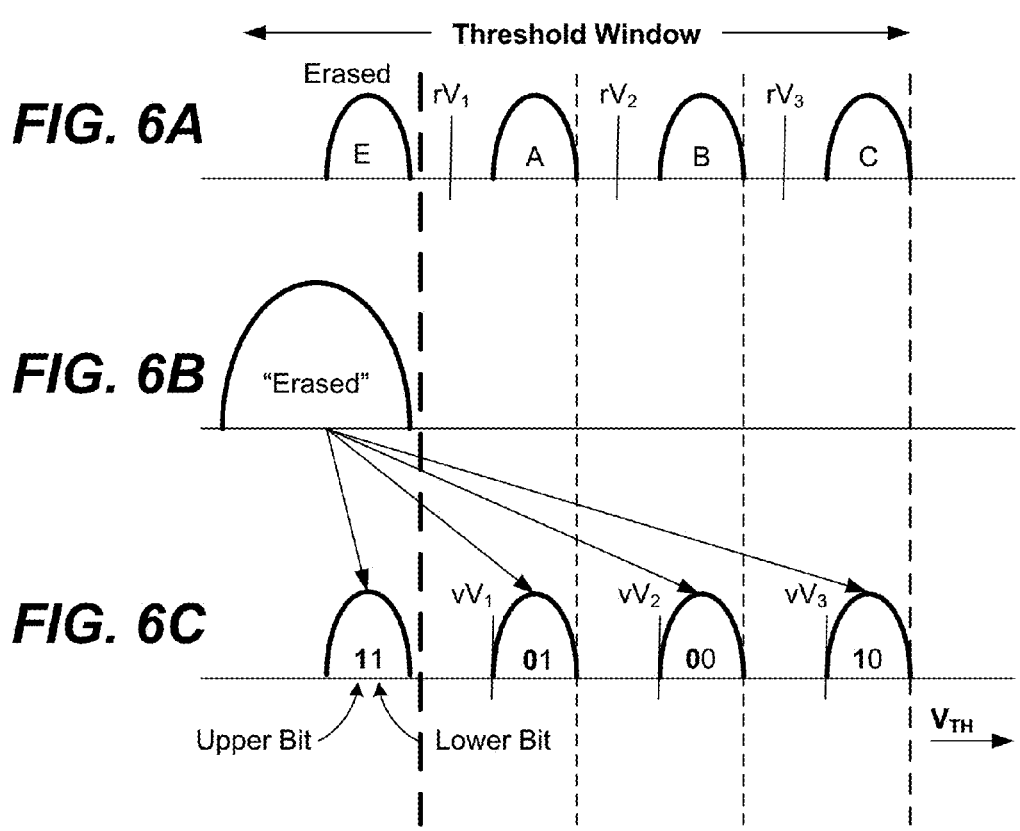

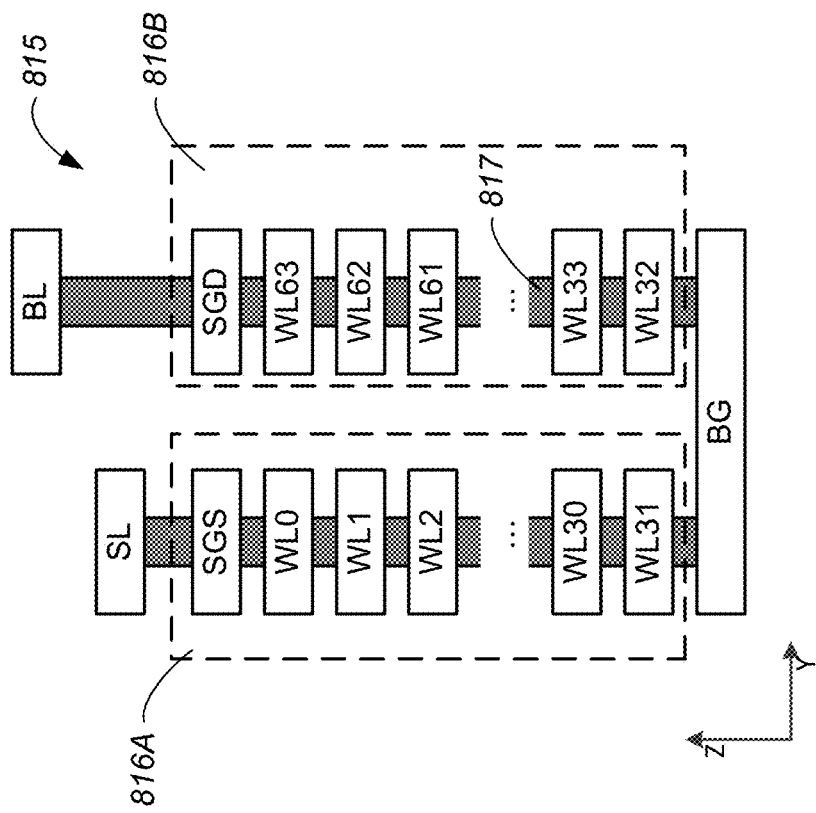
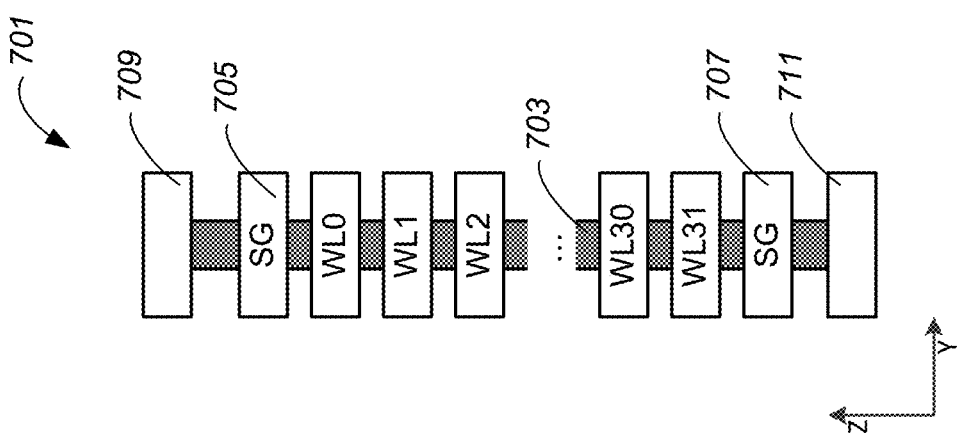
FIG. 8
FIG. 7

| WL # (dec) | String 0 | String 1 | String 2 | String 3 | Page type (lower/upper) |
|---|---|---|---|---|---|
| 0 | 0 | 2 | 4 | 6 | L |
|   | 1 | 3 | 5 | 7 | U |
| 1 | 8 | 10 | 12 | 14 | L |
|   | 9 | 11 | 13 | 15 | U |
| 2 | 16 | 18 | 20 | 22 | L |
|   | 17 | 19 | 21 | 23 | U |
| 3 | 24 | 26 | 28 | 30 | L |
|   | 25 | 27 | 29 | 31 | U |
| 4 | 32 | 34 | 36 | 38 | L |
|   | 33 | 35 | 37 | 39 | U |
| 5 | 40 | 42 | 44 | 46 | L |
|   | 41 | 43 | 45 | 47 | U |
| 6 | 48 | 50 | 52 | 54 | L |
|   | 49 | 51 | 53 | 55 | U |
| 7 | 56 | 58 | 60 | 62 | L |
|   | 57 | 59 | 61 | 63 | U |
| 8 | 64 | 66 | 68 | 70 | L |
|   | 65 | 67 | 69 | 71 | U |
| 9 | 72 | 74 | 76 | 78 | L |
|   | 73 | 75 | 77 | 79 | U |

FIG. 11

| WL # (dec) | String 0 | String 1 | String 2 | String 3 | Page type (lower/upper) |
|---|---|---|---|---|---|
| 0 | 0 | 2 | 4 | 6 | L |
|   | 1 | 3 | 5 | 7 | U |
| 1 | 8 | 10 | 12 | 14 | L |
|   | 9 | 11 | 13 | 15 | U |
| 2 | 16 | 18 | 20 | 22 | L |
|   | 17 | 19 | 21 | 23 | U |
| 3 | 24 | 26 | 28 | 30 | L |
|   | 25 | 27 | 29 | 31 | U |
| 4 | 32 | 34 | 36 | 38 | L |
|   | 33 | 35 | 37 | 39 | U |
| 5 | 40 | 42 | 44 | 46 | L |
|   | 41 | 43 | 45 | 47 | U |
| 6 | 48 | 50 | 52 | 54 | L |
|   | 49 | 51 | 53 | 55 | U |
| 7 | 56 | 58 | 60 | 62 | L |
|   | 57 | 59 | 61 | 63 | U |
| 8 | 64 | 66 | 68 | 70 | L |
|   | 65 | 67 | 69 | 71 | U |
| 9 | 72 | 74 | 76 | 78 | L |
|   | 73 | 75 | 77 | 79 | U |

FIG. 12

| WL # (dec) | Plane 0 | Plane 1 | Plane 2 | Plane 3 | Page type (lower/upper) |
|---|---|---|---|---|---|
| 0 | 0 | 2 | 4 | 6 | L |
| 0 | 1 | 3 | 5 | 7 | U |
| 1 | 8 | 10 | 12 | 14 | L |
| 1 | 9 | 11 | 13 | 15 | U |
| 2 | 16 | 18 | 20 | 22 | L |
| 2 | 17 | 19 | 21 | 23 | U |
| 3 | 24 | 26 | 28 | 30 | L |
| 3 | 25 | 27 | 29 | 31 | U |
| 4 | 32 | 34 | 36 | 38 | L |
| 4 | 33 | 35 | 37 | 39 | U |
| 5 | 40 | 42 | 44 | 46 | L |
| 5 | 41 | 43 | 45 | 47 | U |
| 6 | 48 | 50 | 52 | 54 | L |
| 6 | 49 | 51 | 53 | 55 | U |
| 7 | 56 | 58 | 60 | 62 | L |
| 7 | 57 | 59 | 61 | 63 | U |
| 8 | 64 | 66 | 68 | 70 | L |
| 8 | 65 | 67 | 69 | 71 | U |
| 9 | 72 | 74 | 76 | 78 | L |
| 9 | 73 | 75 | 77 | 79 | U |

FIG. 16

| WL # (dec) | Plane 0 | Plane 1 | Plane 2 | Plane 3 | Page type (lower/upper) |
|---|---|---|---|---|---|
| 0 | 0 | 2 | 4 | 6 | L |
| 0 | 1 | 3 | 5 | 7 | U |
| 1 | 8 | 10 | 12 | 14 | L |
| 1 | 9 | 11 | 13 | 15 | U |
| 2 | 16 | 18 | 20 | 22 | L |
| 2 | 17 | 19 | 21 | 23 | U |
| 3 | 24 | 26 | 28 | 30 | L |
| 3 | 25 | 27 | 29 | 31 | U |
| 4 | 32 | 34 | 36 | 38 | L |
| 4 | 33 | 35 | 37 | 39 | U |
| 5 | 40 | 42 | 44 | 46 | L |
| 5 | 41 | 43 | 45 | 47 | U |
| 6 | 48 | 50 | 52 | 54 | L |
| 6 | 49 | 51 | 53 | 55 | U |
| 7 | 56 | 58 | 60 | 62 | L |
| 7 | 57 | 59 | 61 | 63 | U |
| 8 | 64 | 66 | 68 | 70 | L |
| 8 | 65 | 67 | 69 | 71 | U |
| 9 | 72 | 74 | 76 | 78 | L |
| 9 | 73 | 75 | 77 | 79 | U |

FIG. 17

| WL # (dec) | Lower<br>Program sequence (LM) | Middle<br>Program sequence (Foggy) | Upper<br>Program sequence (Fine) |
| --- | --- | --- | --- |
| 0 | 0 | 2 | 5 |
| 1 | 1 | 4 | 8 |
| 2 | 3 | 7 | 11 |
| 3 | 6 | 10 | 14 |
| 4 | 9 | 13 | 17 |
| 5 | 12 | 16 | 20 |
| 6 | 15 | 19 | 23 |
| 7 | 18 | 22 | 26 |
| 8 | 21 | 25 | 29 |
| 9 | 24 | 28 | 32 |
| 10 | 27 | 31 | 35 |
| 11 | 30 | 34 | 38 |
| 12 | 33 | 37 | 41 |
| 13 | 36 | 40 | 44 |
| 14 | 39 | 43 | 47 |
| 15 | 42 | 46 | 50 |
| 16 | 45 | 49 | 53 |
| 17 | 48 | 52 | 56 |
| 18 | 51 | 55 | 58 |
| 19 | 54 | 57 | 59 |

*FIG. 18*

| WL # (dec) | Lower<br>Program sequence (LM) | Middle<br>Program sequence (Foggy) | Upper<br>Program sequence (Fine) |
| --- | --- | --- | --- |
| 0 | 0 | 2 | 5 |
| 1 | 1 | 4 | 8 |
| 2 | 3 | 7 | 11 |
| 3 | 6 | 10 | 14 |
| 4 | 9 | 13 | 17 |
| 5 | 12 | 16 | 20 |
| 6 | 15 | 19 | 23 |
| 7 | 18 | 22 | 26 |
| 8 | 21 | 25 | 29 |
| 9 | 24 | 28 | 32 |
| 10 | 27 | 31 | 35 |
| 11 | 30 | 34 | 38 |
| 12 | 33 | 37 | 41 |
| 13 | 36 | 40 | 44 |
| 14 | 39 | 43 | 47 |
| 15 | 42 | 46 | 50 |
| 16 | 45 | 49 | 53 |
| 17 | 48 | 52 | 56 |
| 18 | 51 | 55 | 58 |
| 19 | 54 | 57 | 59 |

*FIG. 19*

EFFICIENT SCANNING OF NONVOLATILE MEMORY BLOCKS

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

SUMMARY

In some nonvolatile memory systems, a number of blocks are maintained as open blocks that are partially written and are available for additional writes. While locations of closed blocks may be recorded in nonvolatile memory, locations of open blocks, and locations of data within open blocks may only be recorded in volatile memory in some systems. Accordingly, such location information may be lost when power is lost. Blocks may be scanned when power is received in order to identify open blocks and to find boundaries between written and unwritten portions of such blocks. An efficient scan may initially focus on a first physical portion of the block, such as a particular set of strings in a 3D block, or a particular plane of a multi-plane block. Such a scan may initially only read lower page data (which may be significantly faster than reading upper page data). After a last written word line is identified in the first physical portion, other physical portions may be scanned.

An example of a method of operating a block erasable nonvolatile memory includes: storing data in an open block so that a written portion of the open block contains stored data and an unwritten portion of the open block contains no stored data; subsequently, in response to restoration of power after removal of power, searching for a boundary between the written portion of the open block and the unwritten portion of the open block by: performing a word line by word line binary search of a first physical area of the open block to identify a last written word line of the first physical area of the block; and subsequently, searching for the boundary in at least a second physical area of the open block based on the last written word line of the first physical area of the block identified by the binary search.

The block may be a three dimensional block that is monolithically formed in two or more physical levels of arrays of memory cells having an active area disposed above a silicon substrate, the open block may include separately selectable sets of vertical NAND strings, NAND strings of different sets in the block connected by common bit lines, the first physical area may be a first set of strings and the second physical area may be a second set of strings. The at least the second physical area may include a third set of strings and a fourth set of strings and searching for the boundary in the second physical area may include separately reading word lines of the second, third, and/or fourth sets of strings that correspond to the last written word line of the first set of strings. The open block may store data in Multi Level Cell (MLC) format and the binary search of the first set of strings and the subsequent searching for the boundary in the second, third, and/or fourth sets of strings may be limited to detecting lower page data. The open block may be programmed in a predetermined sequence and, when programming data in a physical level, a word line of the first set of strings may be programmed before any word line of any other set of strings in the physical level. The block may be a metablock that extends across two or more planes, the first area may be in a first plane and the second area may be in a second plane. The block may be a Multi Level Cell (MLC) block that stores at least lower page data and upper page data along a word line and the word line by word line binary search may be limited to lower page data. The search for the boundary in the second physical area may include a lower page search phase followed by an upper page search phase. The method may also include: writing additional data in the unwritten portion of the open block to fill the block; designating the open block as closed; and recording a corresponding closed status indicator and location information in a table stored in the block erasable nonvolatile memory.

An example of a nonvolatile memory system includes: a plurality of blocks of memory cells; and a block search circuit that is configured to search for a boundary between a written portion and an unwritten portion of an open block by initially performing a word line by word line binary search of a first physical area of the block to identify a last written word line in the first physical area of the block and subsequently searching a word line or word lines in at least a second physical area of the block corresponding to the last written word line in the first physical area of the block.

The block may be a three dimensional block that is monolithically formed in two or more physical levels of arrays of memory cells having an active area disposed above a silicon substrate, the open block including separately selectable sets of vertical NAND strings, NAND strings of different sets connected by common bit lines, the first physical area may be a first set of strings and the second physical area may be a second set of strings. The second physical area may include a third set of strings and a fourth set of strings and the block search circuit may be configured to search for the boundary in the second physical area by searching word lines of the second, third, and/or fourth sets of strings that correspond to the last written word line of the first set of strings. The plurality of open blocks may store data in Multi Level Cell (MLC) format and the block search circuit may be configured to perform the binary search of the first set of strings and the subsequent searching for the boundary in the second, third, and/or fourth sets of strings by detecting lower page data only. A programming circuit may be configured to program data in the open block in a predetermined sequence and, when programming data in a physical level, may be configured to program a word line of the first set of strings before any word line of any other set of strings in the physical level. The open block may be a metablock that extends across two or more planes, the first physical area may be in a first plane and the second physical area may be in a second plane. The block may be a Multi Level Cell (MLC) block that stores at least lower page data and upper page data along a word line and the block search circuit may be configured to limit the word line by word line binary search to lower page data. The block search circuit may be configured to search for the boundary in the second physical area in a lower page search phase followed by an upper page search phase. The nonvolatile memory system may also include: a write circuit that is configured to write data to fill open blocks; and a table that records filled block locations in a block of memory cells in the nonvolatile memory system.

An example of a method of operating a block erasable nonvolatile memory includes: storing data in a Multi Level Cell (MLC) block so that a written portion of the MLC block contains stored data and an unwritten portion of the MLC block contains no stored data; subsequently, in response to restoration of power after removal of power, searching for a boundary between the written portion of the MLC block and the unwritten portion of the MLC block by: performing a word line by word line binary search of a first physical area of the MLC block to identify a last written word line of the first physical area of the MLC block, the word line by word line binary search limited to lower page data; and subsequently, searching for the boundary in at least a second physical area of the MLC block based on the last written word line of the first physical area of the MLC block identified by the binary search until a boundary location is determined, the searching including detecting upper page data; subsequently writing additional data in the unwritten portion of the MLC block starting at the boundary location until the MLC block is full; subsequently recording the location of the MLC block in a table stored in the block erasable nonvolatile memory; and subsequently, in response to another restoration of power after another removal of power, searching the table and identifying the MLC block as full without searching for a boundary in the block.

The MLC block may be a three dimensional MLC block that is monolithically formed in two or more physical levels of arrays of memory cells having an active area disposed above a silicon substrate, the open MLC block may include four or more separately selectable sets of vertical NAND strings, NAND strings of different sets connected by common bit lines, the first physical area may be a first set of strings and the second physical area may include at least three additional sets of strings.

Various aspects, advantages, features and embodiments are included in the following description of exemplary examples thereof, which description should be taken in conjunction with the accompanying drawings.

BRIEF DESCRIPTION OF THE DRAWINGS

FIGS. 6A-6C illustrate an example of programming a population of memory cells.

FIG. 7 shows an example of a physical structure of a 3-D NAND string.

FIG. 8 shows an example of a physical structure of a U-shaped 3-D NAND string.

FIG. 11 illustrates an example scanning a 3D block for a boundary between written and unwritten areas.

FIG. 12 illustrates another example of scanning a 3D block for a boundary between written and unwritten areas.

FIG. 16 illustrates an example of scanning a metablock.

FIG. 17 illustrates another example of scanning a metablock.

FIG. 18 illustrates an example of scanning an MLC block.

FIG. 19 illustrates another example of scanning an MLC block.

DETAILED DESCRIPTION

Memory System

Figure 1:
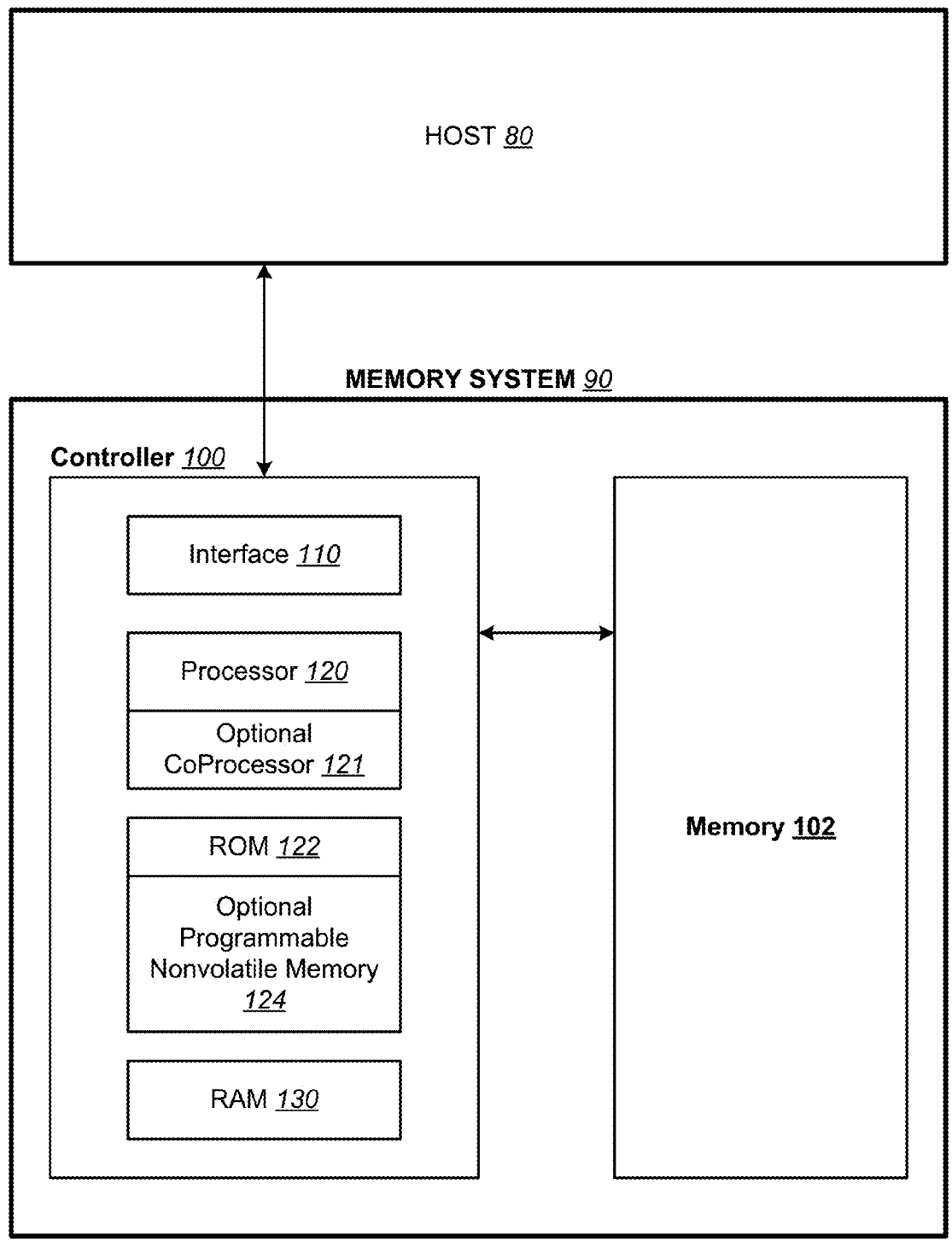
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
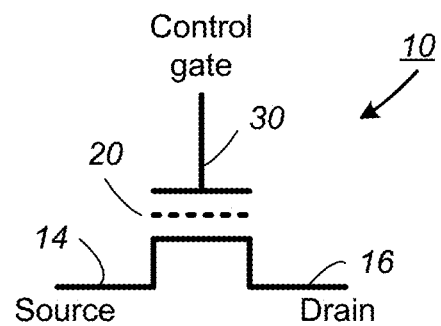
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
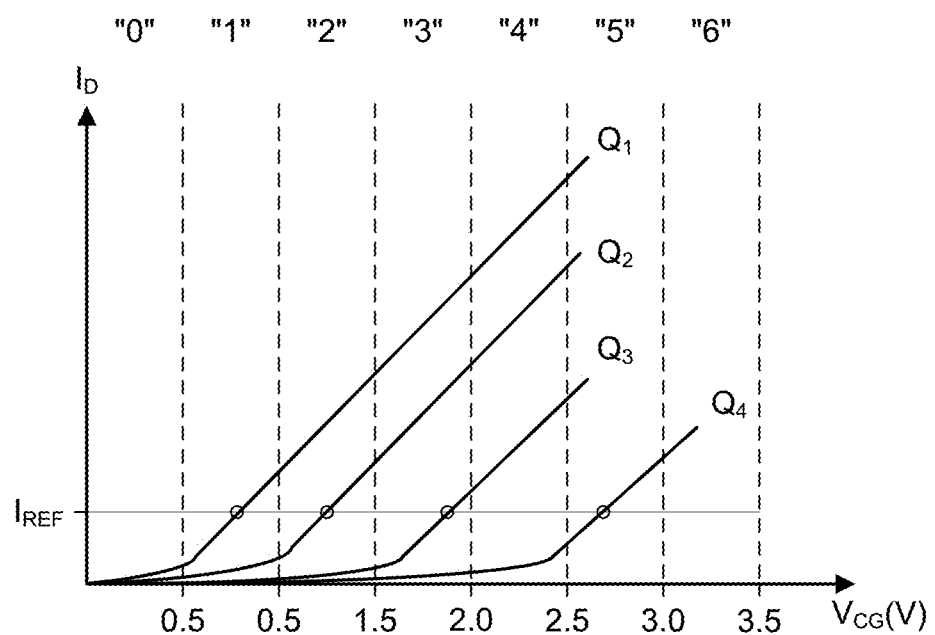
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
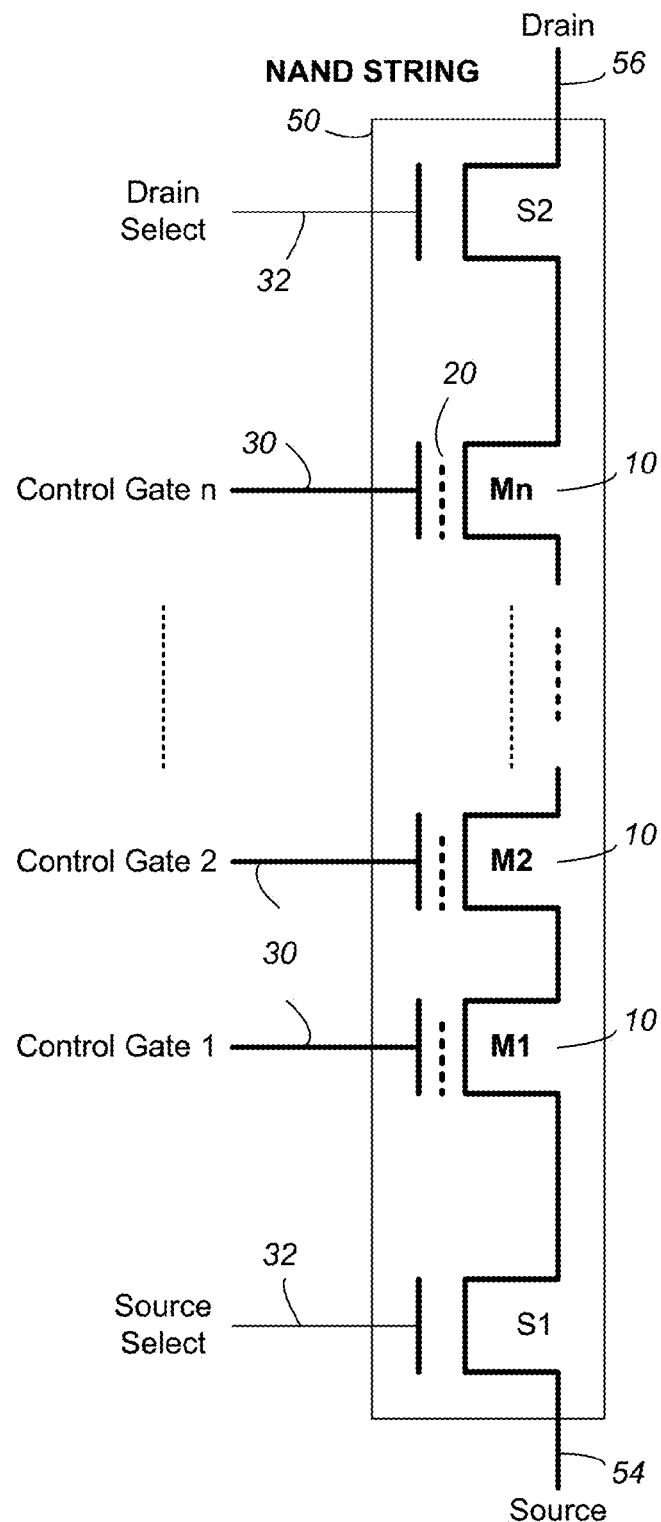
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
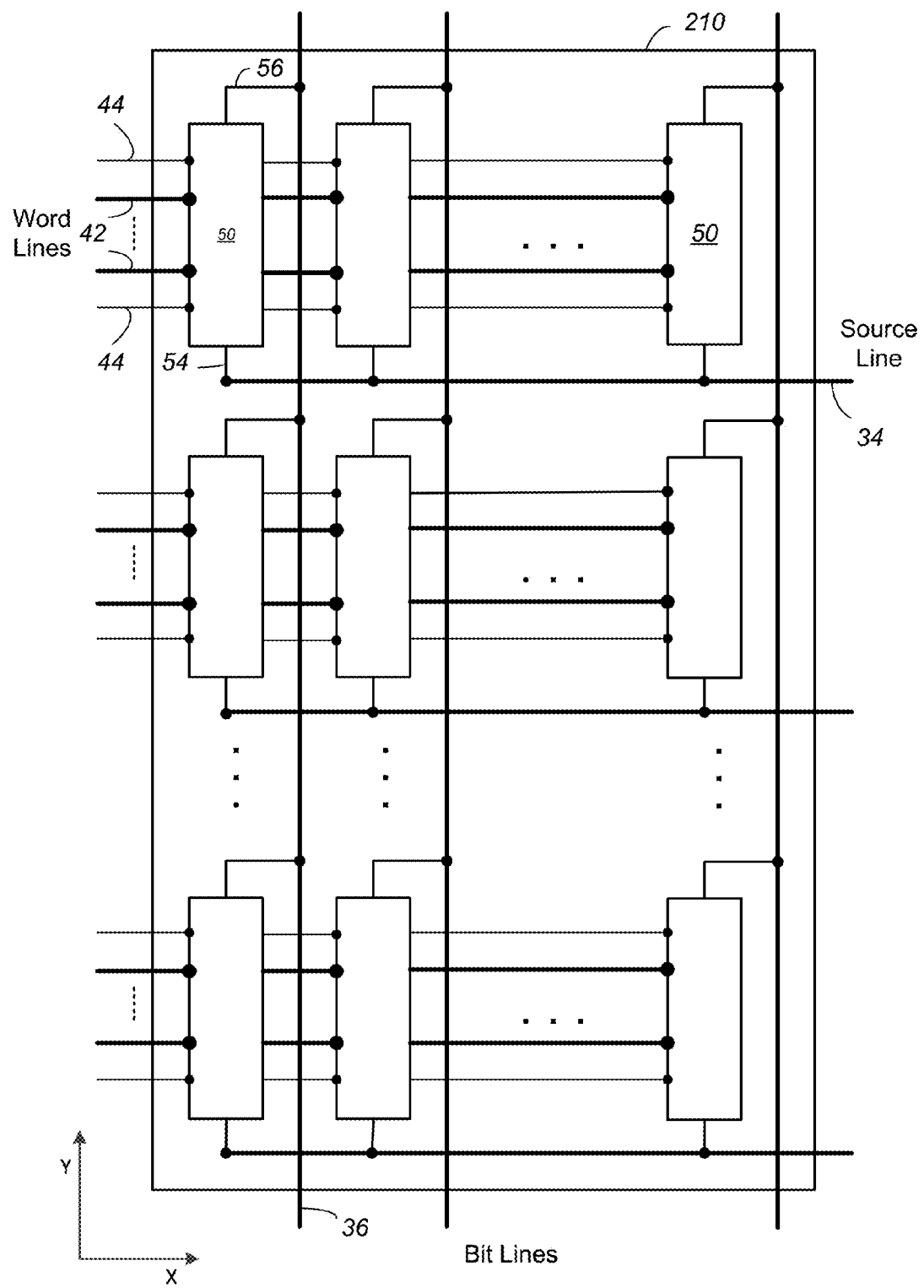
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
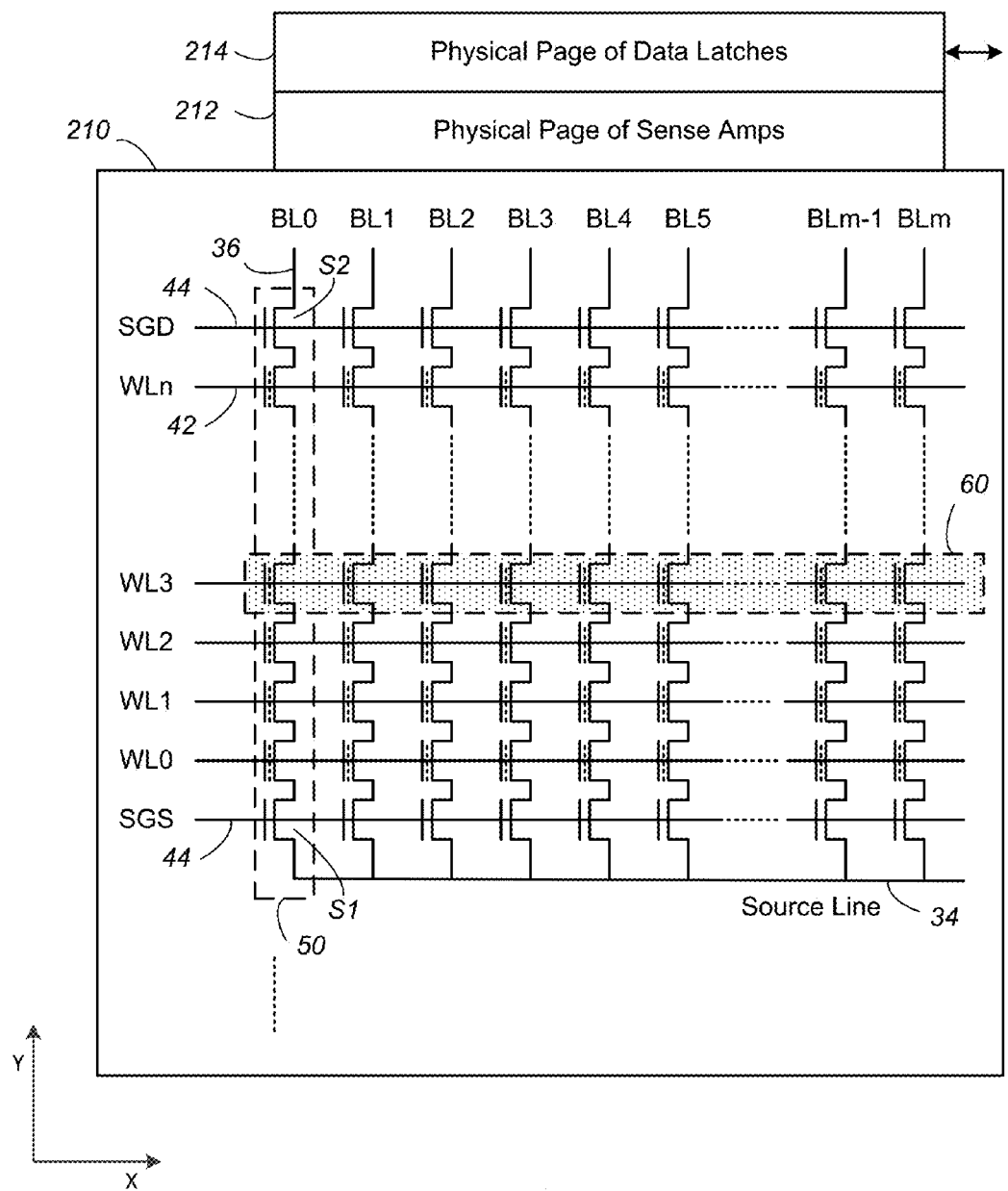
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell (a Single Level Cell, or SLC" memory), one physical page stores one logical page of data. In memories that store two bits per cell, a physical page stores two logical pages. The number of logical pages stored in a physical page thus reflects the number of bits stored per cell. The term Multi Level Cell, or "MLC" is generally used to refer to memories that store more than one bit per cell, including memories that store three bits per cell (TLC), four bits per cell, or more bits per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three subpasses respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
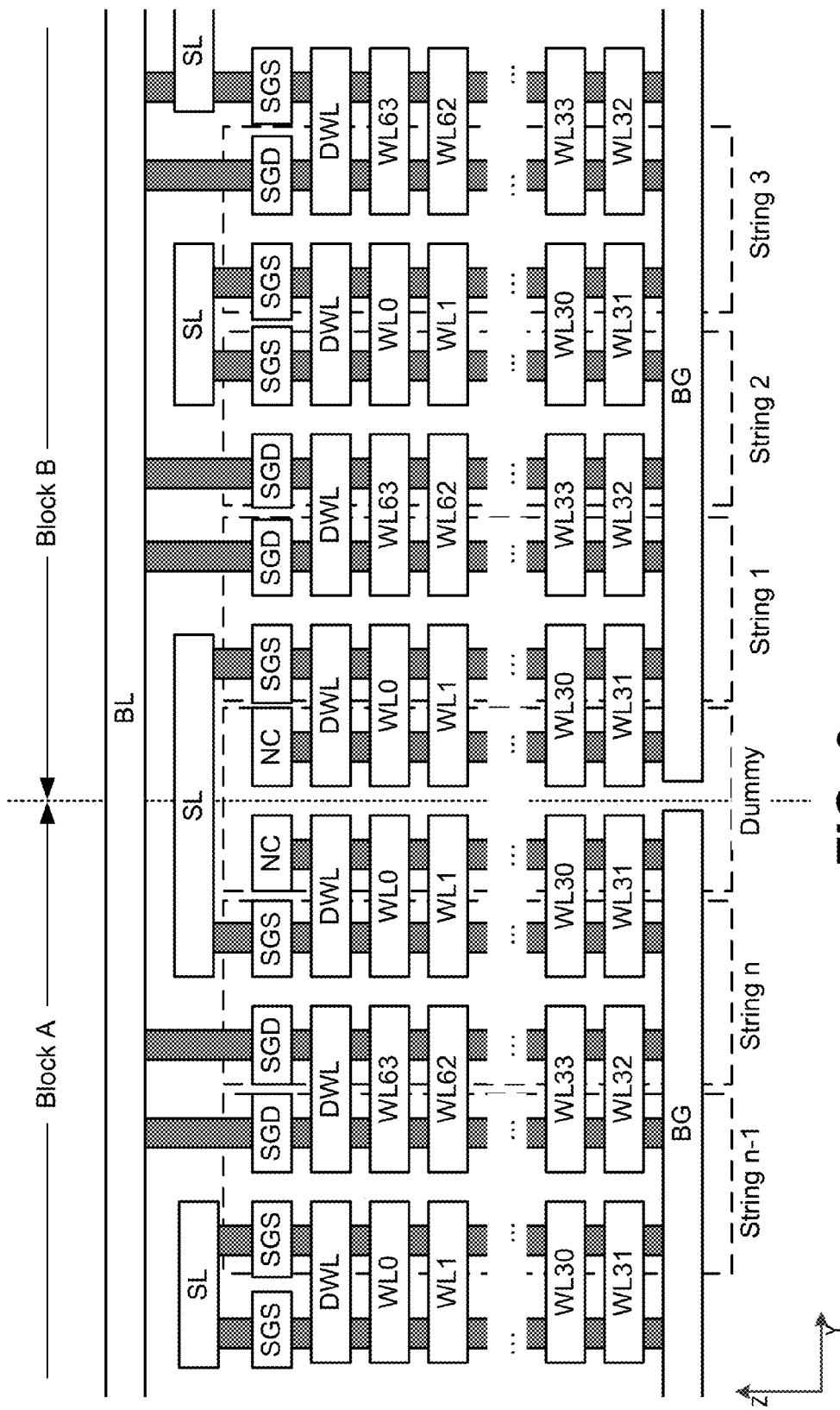
FIG. 9 shows an example of a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10:
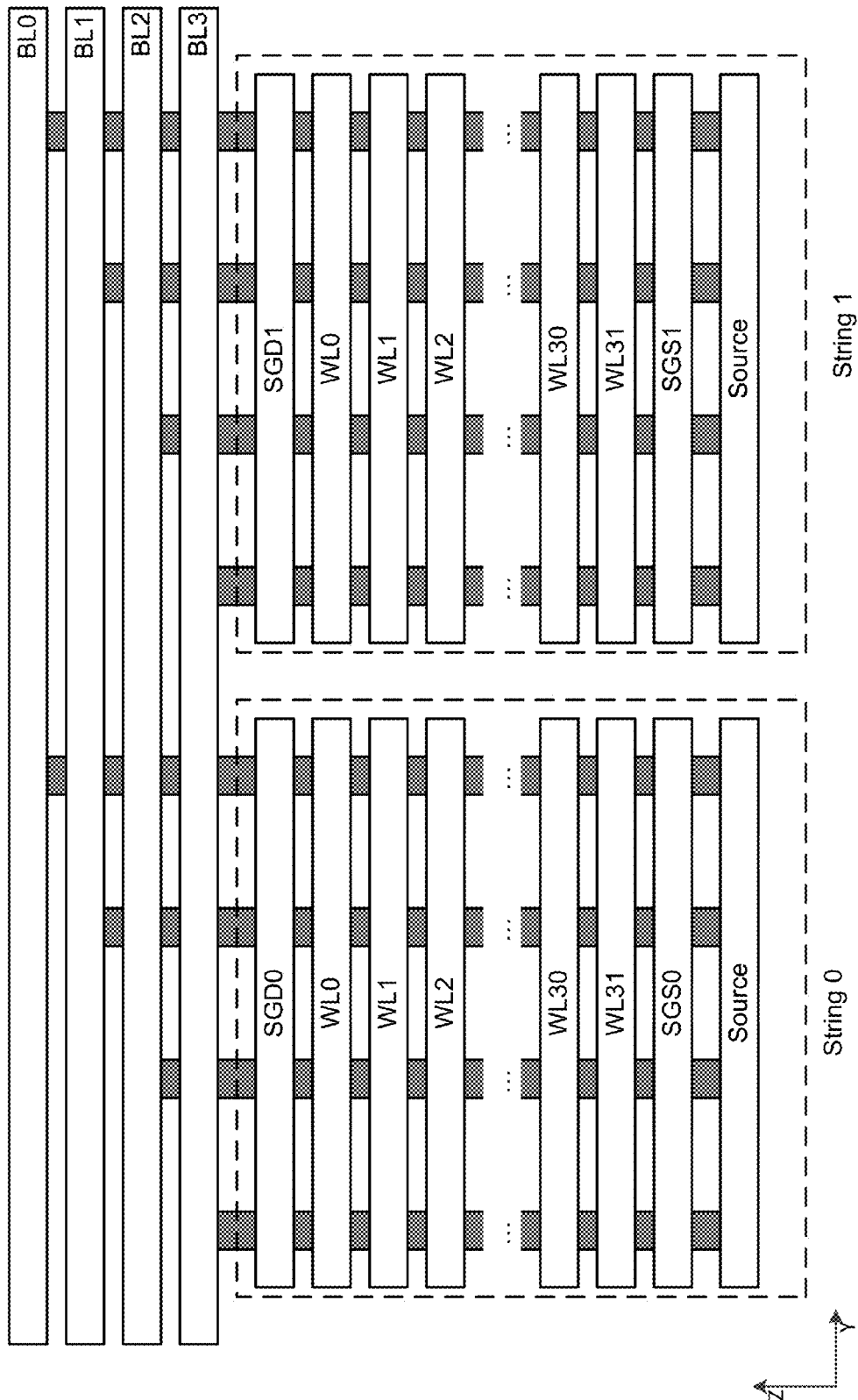
FIG. 10 shows an example of a cross section of a 3-D NAND memory with straight NAND strings in the y-z plane.

FIG. 10 shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. Memory hole structures extend down through these sheets of conductive material to form memory cells. Within a given block there are multiple NAND strings connected to a given bit line. NAND strings are grouped into sets of strings that share common select gates. Thus, for example, NAND strings that are selected by SGS0 and SGD0 may be considered a set and may be designated as String 0, while NAND strings that are selected by SGS1 and SGD1 may be considered as a set and may be designated as String 1 as shown. A block may consist of any suitable number of such sets of strings. It will be understood that the cross-section of FIG. 10 shows portions of BL0-BL3, these bit lines extend further in the y-direction. Furthermore, additional bit lines extend parallel to BL0-BL3 (e.g. at different locations along x-axis, in front of, or behind the location of the cross-section of FIG. 10). Other three dimensional memories are based on resistive elements rather than charge storage elements.

Block Scanning

In some nonvolatile memory systems (including memory systems with 3D memory arrays and 2D memory arrays), after a block is filled with data, the status of the block and its location is recorded in a portion of the nonvolatile memory. For example, a logical-to-physical map may record where user data is located. A block may be designated as "closed" so that it is no longer available for storage of data. Its closed status may be recorded in nonvolatile memory. In some cases, a block may be closed before it is entirely filled so that there is some unwritten space. In general, such space remains unwritten for the remainder of a write-erase cycle once the block is closed. When the memory system first powers up after being powered down, location data may be read out of the nonvolatile memory and may be used by the memory controller to identify where particular user data is located.

In addition to such closed blocks, some blocks may be partially filled with data and may be maintained in an open state in which they are ready to store additional data. In general, the number of such blocks is limited in order to reduce the burden of managing such open blocks. Other blocks may be in an erased condition, containing no data.

In some cases, locations of open blocks, and/or the amount of data written in such blocks, is not recorded in nonvolatile memory as data is written. The locations of open blocks and/or the amount of data written in such blocks may be maintained in volatile memory (e.g. in a ROM in a memory controller) while the blocks remain open and may be saved to nonvolatile memory only when blocks are closed. In some cases, the locations of erased blocks are not recorded in nonvolatile memory so that it may be unclear which blocks are erased, so they contain no data, and which are open blocks, which contain some data. As long as power is maintained, locations of erased and open blocks may be accessible in volatile memory. However, such data is generally lost when power is removed so that when the memory system powers up again the locations of open blocks, and the locations of data within such blocks must be determined. While closed blocks are identifiable from data recorded in nonvolatile memory, erased blocks and open blocks may not be easily identifiable.

In some cases a memory system performs a scan operation to determine where open blocks are located and where data is located within such open blocks. A record of closed blocks from nonvolatile memory may be used to eliminate closed blocks from a list of blocks to be scanned. Other blocks may also be eliminated (e.g. bad blocks, blocks that are dedicated to some particular function, or other blocks known not to be open blocks). The remaining list of blocks may be scanned to determine which blocks are erased, which are open, and where data is located in open blocks.

In many memory systems, blocks are written in a predetermined order. For example, in many NAND memories, data is written from one end of NAND strings (e.g. drain or source) and proceeds sequentially word line by word line along NAND strings to the other end. In 3D NAND memory, programming may start with the first word line in each set of strings (i.e. WL0 of string 0, then WL0 of string 1, then WL0 of string 2, and so on) and then move to the next word line of each set of strings (i.e. WL1 of string 0, then WL1 of string 1, and so on). Thus, to determine whether a block is erased, it may be sufficient to read the first word line (in order of programming) and if this word line is unwritten then the block may be identified as unwritten (erased).

When a block is identified as partially written then some further analysis may be needed to determine where data is located in the block. This means determining how much of the block has been programmed and how much remains unprogrammed, i.e. determining where the boundary lies between the written portion of the block and the unwritten portion of the block. In a block that is programmed sequentially, a search, or scan, may be performed to find the boundary between the written portion and the unwritten portion.

In some memory systems, the time required for a memory system to become fully operational after it receives power is an important parameter. Where an open block scan is performed upon receiving power, the time taken to perform such a scan may be an important factor in overall power up time for the memory system, and for a larger system that depends on the memory (e.g. a laptop computer with an SSD memory).

Performing an open block scan includes multiple read operations. However, read operations are known to cause "read disturb" errors (i.e. reading data includes applying voltages that may affect stored data and may increase error rates in the stored data). It is generally desirable to perform a small number of reads so that the number of read disturb errors can be kept small. Particularly where a memory system is likely to store the same data during multiple power cycles, read disturbs caused by scan operations may be a concern.

Scanning 3D Blocks

FIG. 11 illustrates an example of an open block scan operation applied to a three dimensional MLC NAND block that includes four sets of strings (String 0-3), each NAND string having ten word lines (WL0-9), and with two bits per cell (i.e. two logical pages, an upper page and a lower page, in each physical page). Entries indicate the order of programming and thus reflects logical page order from 0 to 79, i.e. 80 logical pages are stored, two per physical page, with each word line forming a physical page (WL0 in string 0 is a physical page, WL0 in string 1 is a physical page, etc.) Programming starts with lower page data of WL 0 of String 0, then upper page data of WL 0 of String 1, then lower and upper page data of WL0 of String 1 and so on for WL0s of all strings (Strings 0-3 in this example). Lower and upper page programming may be performed together in a single operation in what may be referred to as "Full Sequence Programming" or in sequential programming operations. When WL0 of each string is written, the write sequence proceeds to the next word line in the next physical level of the three dimensional block. For example, if programming starts with the uppermost physical level then the next physical level down, containing WL1 may be programmed next, followed by the next physical level down, containing WL2, and so on. Programming may alternatively start from the bottom and proceed upwards. In this example, programming ended after programming WL1 of string 2. Programmed pages are shown as shaded while unprogrammed pages are not shaded.

The scan operation follows a binary pattern (half-interval search) that reads pages at or near a midpoint of the remaining search interval in each iteration so that the search interval is halved for the subsequent iteration. Thus, the search for the boundary between written and unwritten portions is narrowed in each iteration until the boundary location is identified. The scan operation shown in FIG. 11 starts at logical page 39, that is the logical page at the midpoint of the block. (With logical pages 0-80, the logical half-way point lies between logical pages 39 and 40 and either of these logical pages may be considered to be at the midpoint.) When logical page 39 is read (step A) and found to be unwritten, the search is narrowed to logical pages 0-39 (half the original interval of 0-79) and a midpoint of this search interval, logical page 19, is selected. When logical page 19 is read (step B) and found to be unwritten, the search interval is narrowed to logical pages 0-19 and a midpoint of this search interval, logical page 9, is read (step C). When logical page 9 is read and found to be written, the search interval is narrowed to logical pages 9-19 and a midpoint of this search interval, logical page 14, is read (step D). When logical page 14 is read and found to be unwritten, the search interval is narrowed to logical pages 9-14 and a midpoint of this search interval, logical page 11, is read (step E). When logical page 11 is read and found to be written, the search interval is narrowed to logical pages 11-14 and a midpoint of this search interval, logical page 12, is read (step F). When logical page 12 is read and found to be written, the search interval is narrowed to logical pages 12-14 and a midpoint of this search interval (the only remaining unread page in the area) logical page 13, is read (step G). When logical page 13 is found to be written the search is complete and the location of the boundary between written and unwritten portions of the block is identified as being between logical page 13 (found to be written) and logical page 14 (found to be unwritten).

FIG. 12 illustrates an alternative scan operation that is different to the operation of FIG. 11 in several respects. Instead of searching in a binary search pattern based on logical pages, a first phase performs a binary search that is limited to word lines of a particular physical area, in this case, a first set of strings, String 0. Only after this phase is complete does the search extend to additional sets of strings (i.e. to strings 1-3). Furthermore, because programming of upper and lower pages are performed together in this example, only lower pages are read. In general, reading lower pages is faster than reading upper pages so that restricting searching to lower pages in this phase makes searching faster. With ten word lines in String 0, a midpoint is selected, WL4, and the lower page of WL4 (logical page 32) is read (step A). When WL4 is found to be unwritten (the lower page of WL4 in String 0 being unwritten indicates that upper and lower pages of WL4 in all strings are unwritten because of programming order) the search is narrowed to WL0-4 and WL2 is selected as a midpoint of this search interval. Accordingly, the lower page of WL2 of String 0 (logical page 16) is read (step B). When this page is found to be unwritten, the search interval is narrowed to WL0-2 and WL1 is selected as a midpoint of this search interval. Accordingly, the lower page of WL1 in String 0 (logical page 8) is read (step C). When this page is found to be written, the search interval is narrowed to WL1 (i.e. no portion of WL2 in any string is programmed because lower page data of WL2 in string 0 was not programmed, while at least some data is programmed WL1, at least in string 1).

Having identified WL1 in string 0 as the last written word line in string 0, the search may now move to a second phase which extends beyond string 0. This second phase performs a binary search of word lines of other strings that correspond to WL1 of string 1 (i.e. WL1s of other strings 1-3). String 2 is selected as a midpoint and the lower page of WL1 in String 2 (logical page 12) is read (step D). When this page is found to be written, the search proceeds to string 3, where the lower page of WL 1 (logical page 14) is read (step E). When this page is found to be unwritten, then the location of the boundary has been found. No reading of upper page data is necessary in this case because lower and upper page data are programmed together in this memory system. In other cases, an additional upper page phase may be added.

Comparing the scan operations of FIGS. 11 and 12 it can be seen that the scan of FIG. 12 found the boundary using five reads (steps A-E) while the scan of FIG. 11 required seven reads (steps A-G). Furthermore, the reads of FIG. 12 were all lower page reads, while five of the seven reads of FIG. 11 were upper page reads. Thus, FIG. 12 represents a considerable time saving over FIG. 11. Also, the reduced number of reads, and using only lower page reads, reduces the read disturb effects on stored data. The technique described above with respect to sets of strings in a 3D block is not limited to such a physical structure but may be applied to a variety of different structures.

Scanning Metablocks

In some memory systems, a memory array is formed of multiple planes. Each plane generally has dedicated read read/write circuits such as data latches, and sense amps, to allow multiple planes to operate in parallel. Each plane may contain multiple blocks that may be connected by a common set of bit lines. While different planes may be operated largely independently, in some cases, planes are linked to facilitate parallelism. For example, individual blocks of different planes may be linked together to form a multi-plane block or metablock. Such a metablock may be accessed as a unit which allows a high degree of parallelism during write and read operations.

Figure 13:
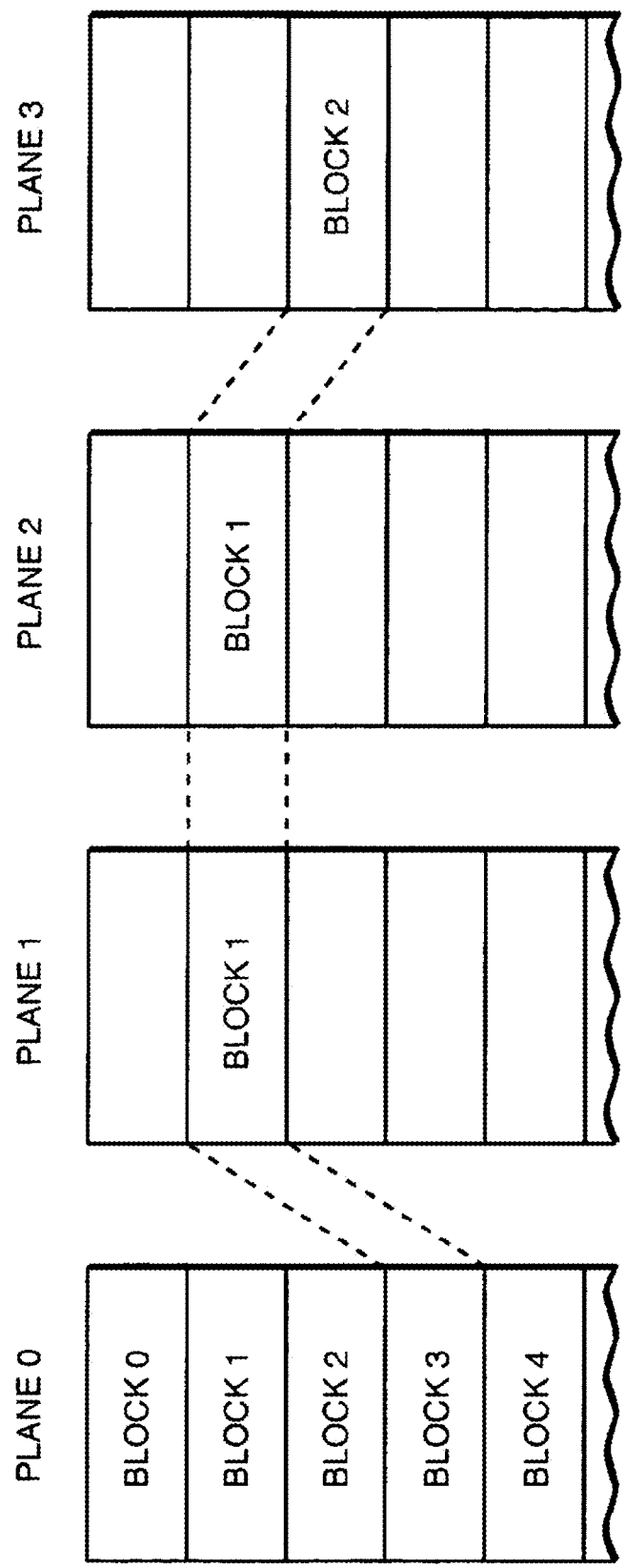
FIG. 13 illustrates linking blocks of different planes to form a metablock.

FIG. 13 shows an example of four planes (planes 0-3) including four individual blocks that are linked together to form a multi-plane block or metablock. This allows data to be written across four planes at a time and read across four planes at a time. Blocks may be statically linked to form metablocks (e.g. one time configuration during initialization) or may be dynamically linked (e.g. a memory controller may change block linking during the lifetime of the memory). In memory systems that use metablocks, the metablock may be treated as a unit so that recording locations of closed blocks and the data stored in them may be done on a metablock-by-metablock basis.

Figure 14:
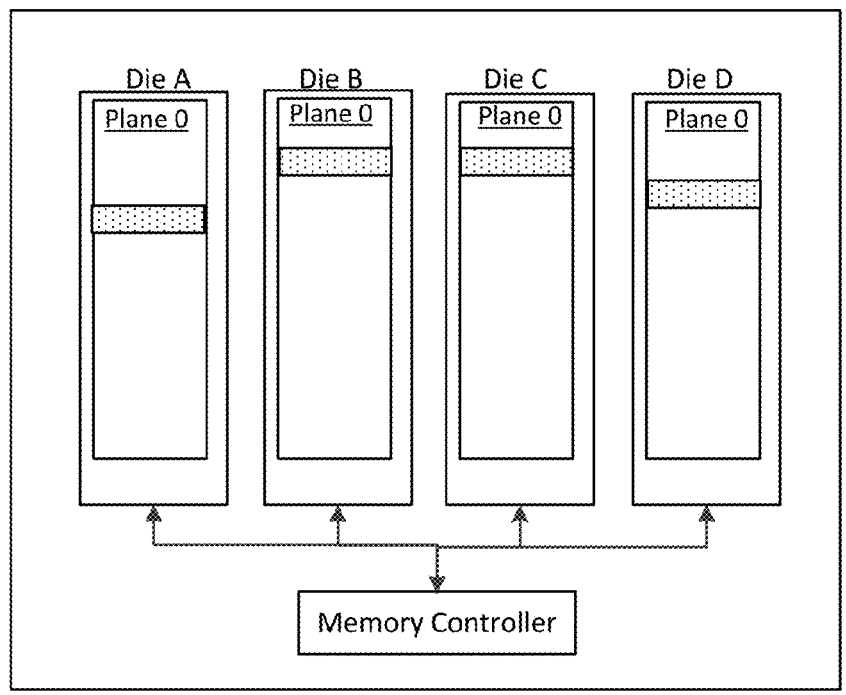
FIG. 14 illustrates an example of a multi-plane arrangement.

A single die may include one, two, or more planes. FIG. 14 shows an example where each die (Dies A-D) includes a single plane. Blocks from dies A-C may be linked to form a metablock (shown by shaded portions). A memory controller may send data to the dies over a shared bus and then data may be programmed in parallel. Data may also be read in parallel in dies A-D and sent to the memory controller.

Figure 15:
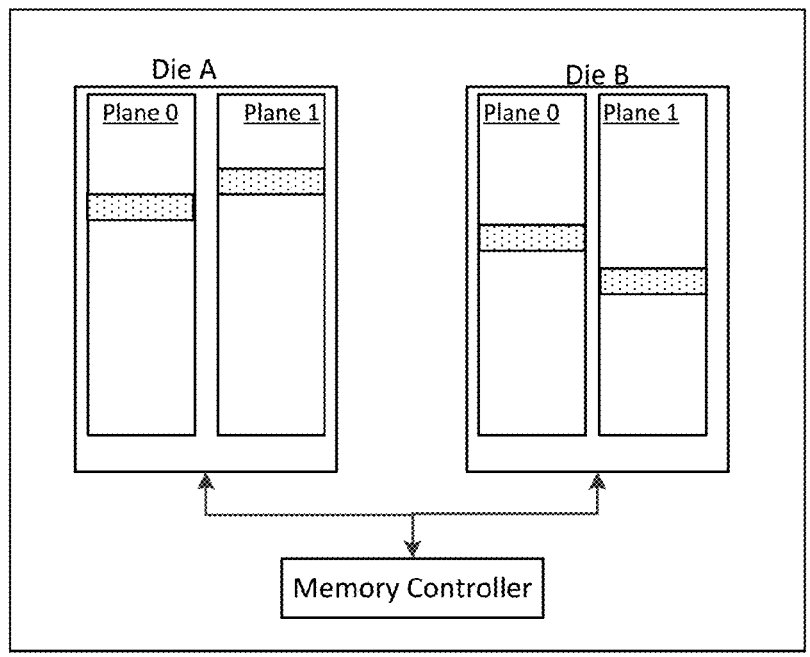
FIG. 15 illustrates another example of a multi-plane arrangement.
Figure 20:
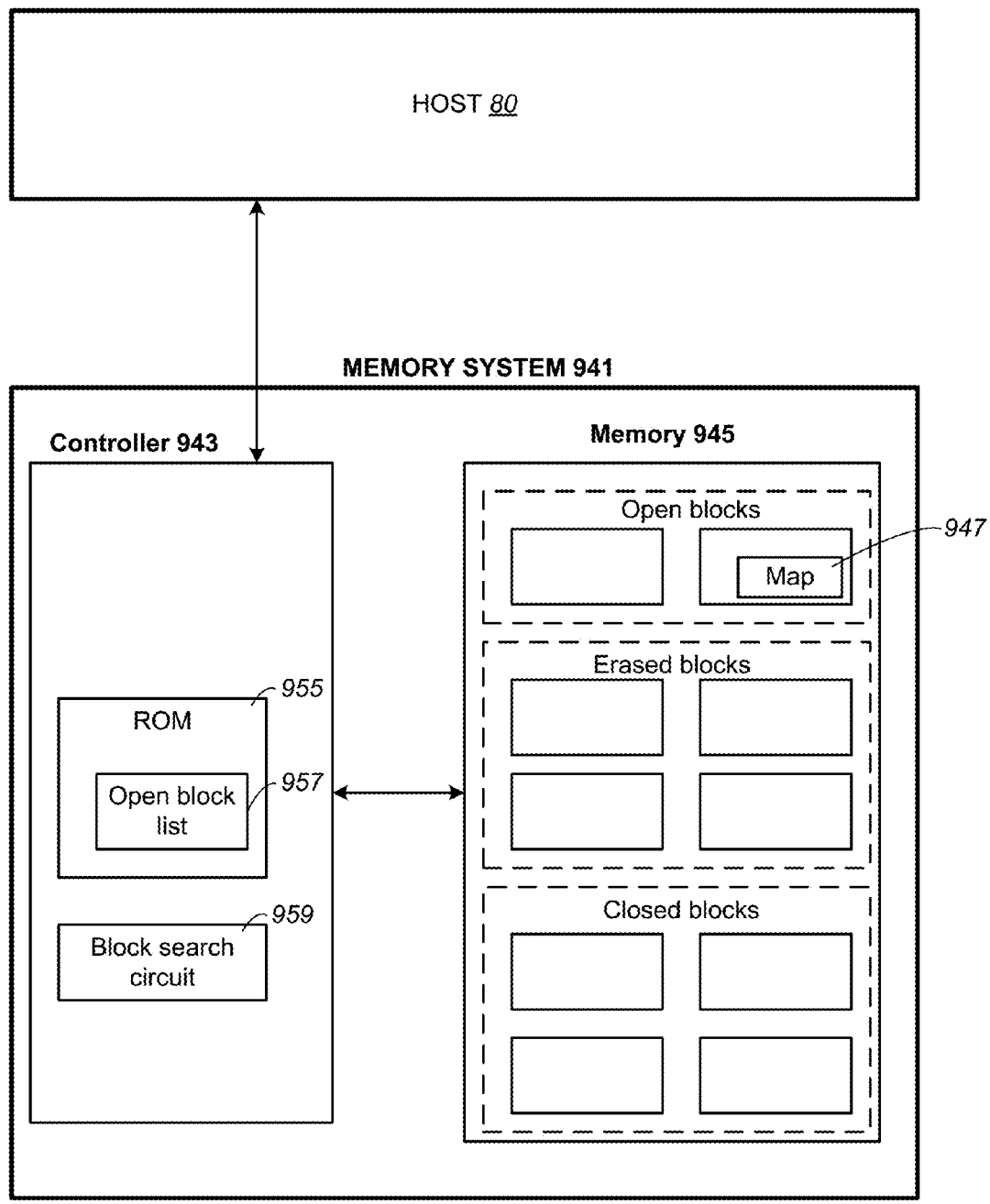
FIG. 20 illustrates an example of memory system hardware.

FIG. 15 shows an example where two dies (Dies A-B) each contain two planes (planes 0-1). Blocks are linked to form a metablock that extends across the four planes of dies A-B (as shown by shaded portions). It will be understood that metablocks may extend across any number of dies and/or planes to provide different degrees of parallelism.

As with single-plane blocks, some metablocks may be maintained as open blocks and scanning may be performed to identify which metablocks are partially-written open metablocks when power is returned after powering off. While scanning may be performed across all planes of a metablock in parallel (e.g. by performing multi-plane reads), in some cases, this may not be desirable. In particular, in some memories (particularly memories with small feature sizes) read disturbance may be a significant source of errors. In such memories, reading across all planes in parallel may cause significant read disturbance.

FIG. 16 shows an example of scanning an MLC metablock (multi-plane block) that extends across four planes (planes 0-3). The scan operation shown in FIG. 16 starts at logical page 39, that is the logical page at the midpoint of the block. (With logical pages 0-80, the logical half-way point lies between logical pages 39 and 40 and either of these logical pages may be considered to be at the midpoint.) When logical page 39 is read (step A) and found to be unwritten, the search is narrowed to logical pages 0-39 (half the original interval of 0-79) and a midpoint of this search interval, logical page 19, is selected. When logical page 19 is read (step B) and found to be unwritten, the search interval is narrowed to logical pages 0-19 and a midpoint of this search interval, logical page 9, is read (step C). When logical page 9 is read and found to be written, the search interval is narrowed to logical pages 9-19 and a midpoint of this search interval, logical page 14, is read (step D). When logical page 14 is read and found to be written, the search interval is narrowed to logical pages 14-19 and a midpoint of this search interval, logical page 16, is read (step E). When logical page 16 is read and found to be unwritten, the search interval is narrowed to logical pages 14-16 and a midpoint of this search interval, the only remaining logical page in the search interval, logical page 15, is read (step F). When logical page 15 is read and found to be written, the search is complete and the location of the boundary between written and unwritten portions of the block is identified as being between logical page 15 (found to be written) and logical page 16 (found to be unwritten).

FIG. 17 illustrates an alternative metablock scan operation that is different to the operation of FIG. 16 in several respects. Instead of searching in a binary search pattern based on logical pages, a binary search is limited to word lines of a particular physical area, in this case, a first plane, plane 0. Because blocks of planes 0-3 are programmed in parallel, it may be assumed that if a particular word line in plane 0 is written, then corresponding word lines in planes 1-3 are also written (e.g. if WLn of plane 0 is written then WLn of planes 1-3 are also written). Furthermore, because programming of upper and lower pages are performed together in this example, only lower pages are read. In general, reading lower pages is faster than reading upper pages so that restricting searching to lower pages in this phase makes searching faster. With ten word lines in plane 0, a midpoint is selected, WL4, and the lower page of WL4 in plane 0 (logical page 32) is read (step A). When WL4 is found to be unwritten (the lower page of WL4 in plane 0 being unwritten indicates that upper and lower pages of WL4 in all planes are unwritten because of parallel programming across planes) the search is narrowed to WL0-4 and WL2 is selected as a midpoint of this search interval. Accordingly, the lower page of WL2 of plane 0 (logical page 16) is read (step B). When this page is found to be unwritten, the search interval is narrowed to WL0-2 and WL1 is selected as a midpoint of this search interval. Accordingly, the lower page of WL1 in plane 0 (logical page 8) is read (step C). When lower page data is found on WL1 of plane 0, it may be assumed that WL1 of planes 1-3 are similarly written. Also, because lower and upper page data are written together, it may be assumed that lower and upper page data are written on WL1 of planes 0-3. Accordingly, the scan operation may terminate and the boundary between written and unwritten portions of the block is determined to run between WL1 and WL2 across all planes.

Comparing the scan operations of FIGS. 16 and 17 it can be seen that the scan of FIG. 17 found the boundary using three reads (steps A-C) while the scan of FIG. 16 required six reads (steps A-F). Furthermore, the reads of FIG. 17 are all lower page reads, while four of the six reads of FIG. 16 are upper page reads. Thus, FIG. 17 represents a considerable time saving over FIG. 16. Also, the reduced number of reads, and using only lower page reads, reduces the read disturb effects on stored data.

FIG. 18 shows another example of a binary search of a block in which data along a word line is programmed in three phases, lower page, or lower mode "LM"; "Foggy" (rough programming of upper page data); and "Fine" (higher resolution programming of upper page data). Data is programmed in the sequence shown (entries in the table represent the order of programming steps) with foggy programming of upper page data performed only after the next word line is programmed with lower page (LM) data. For example, foggy programming of upper page data along WL0 (logical page 2) only occurs after LM programming of WL1 (logical page 1). Fine programming of upper page data along a word line only occurs after the next word line undergoes foggy programming of upper page data. For example, fine programming of upper page data on WL0 (logical page 5) only occurs after foggy programming of upper page data along WL1 (logical page 4). This stepped pattern of programming reduces disturbance effects on data stored along a word line when programming the next word lines. In particular, upper page data, which is particularly susceptible to disturbance is only programmed after lower page data is programmed on the next word line, and upper page data is programmed in two steps so that upper page data is only fully programmed (fine programming) after some upper page data (foggy programming) is performed along the next word line in programming order.

FIG. 18 shows a block scan operation in which a binary search is performed by order of programming. In this case, there are forty logical pages of data (upper and lower page data along twenty word lines, with one physical page per word line). However, there are sixty programming steps (entries 0 to 59) because upper page programming is performed in two steps, foggy and fine. In the first iteration, programming step 29 (fine programming of WL8) is identified as a midpoint and a corresponding upper page read is performed (step A). When this read indicates no upper page data stored along WL8, the search interval is narrowed to programming steps 0-29 and a midpoint, programming step 14 (fine programming on WL3) is selected. A read operation is performed to read upper page data on WL3 (step B). When no upper page data is found on WL3, the search is narrowed to programming steps 0-14 and a midpoint, programming step 7 (foggy upper page programming of WL2), is selected. An upper page read along WL2 is performed (step C) and no upper page data is found. The search is narrowed accordingly to programming steps 0-7 and a midpoint, programming step 3 (lower page data on WL2) is selected. A lower page read is performed on WL2 (step D) and lower page data is found. The search is narrowed to programming steps 3-7 and a midpoint, programming step 5 (fine programming on WL0) is selected. An upper page read is performed on WL0 (step E) and data is found. The search is then narrowed to programming steps 5-7 and the remaining programming step, programming step 6 (lower page programming on WL3), is selected. Reading lower page data of WL3 (step F) shows no data and a determination is made that programming stopped between programming step 5 and programming step 6. In this case, the boundary between written and unwritten areas of the block extends through more than one word line. While WL0 is fully written, and WL3 is unwritten, WL1 and WL2 are partially written.

FIG. 19 shows an alternative scan operation that is adapted for an MLC block that is written using foggy fine programming. A lower page scanning phase is limited to reading lower page data in order to identify a last written word line. With twenty word lines (WL0-19), WL9 is selected as a midpoint and a lower page read is performed on WL9 (step A). When no lower page data is found on WL9, the search is narrowed to WL0-9 and WL4 is selected as a midpoint. Reading lower page data on WL4 (step B) shows that it is unwritten and the search is narrowed to WL0-4. WL2 is selected as a midpoint and a lower page read is performed on WL2 (step C). When lower page data is found on WL2, the search is narrowed to WL2-4 and the remaining word line, WL3 is selected and a lower page read performed on WL3 (step D). When this read indicates no lower page data on WL3, the lower page scanning phase is complete.

Subsequently, an upper page scanning phase begins. Because the lower page scan indicated that programming stopped between lower page programming of WL2 and lower page programming of WL3, the upper page scanning focuses on word lines for which upper page programming would occur in this interval. In this programming sequence, upper page data of WL0 (fine) and WL1 (foggy) corresponding to programming steps 5 and 6 are the subject of the upper page scanning phase. WL0 is selected and an upper page read is performed (step E). When this read indicates upper page data on WL0, the extent of upper page programming is identified (because fine programming of WL0, programming step 5, occurs after foggy programming of WL1, programming step 4, it is clear that both of these programming steps have occurred). Thus, the boundary between written and unwritten portions is determined.

Comparing FIGS. 18 and 19 it can be seen that while the block scan operation of FIG. 18 required six read steps, four of which were upper page reads, the block scan operation of FIG. 19 is completed in five steps, only one of which is an upper page read. Thus, a considerable time saving is achieved and the potential for read disturbs is reduced (upper page reads are more likely to cause read disturbs).

FIG. 19 illustrates an example of a memory system 941 that may be used to implement some of the techniques described above. It will be understood that the memory system may include various additional components, such as those illustrated in FIG. 1, in addition to the components shown here. Memory system 941 includes a controller 943 and nonvolatile memory 945. Nonvolatile memory 945 may be formed in one or more memory dies, each including one or more planes and may be formed as planar, or 3D memory and may include SLC and/or MLC blocks. Memory 945 includes open blocks that are partially written and are available for storing additional data. Closed blocks are generally full and are not available for storing additional data. Information that identifies closed blocks is stored in a map 947 in nonvolatile memory 945. In this example, map 947 is stored in an open block and is regularly updated as blocks are closed. Controller 943 includes a volatile memory ROM 955 which stores an open block list 957 that indicates the locations of open blocks. When power is lost, data including the open block list 957 is lost (while closed block map 947 nonvolatile memory 945 is not lost). A block search circuit 959 is configured to scan for blocks that are not identified as closed blocks to determine if they are erased, and to search for a boundary between a written portion and an unwritten portion of an open block (e.g. using one of the techniques described above).

CONCLUSION

The foregoing detailed description has been presented for purposes of illustration and description. It is not intended to be exhaustive or to limit the attached claims. Many modifications and variations are possible in light of the above teaching.

It is claimed:

1. A system comprising:
a plurality of blocks of memory cells; and
a block search circuit configured to search for a boundary between a written portion and an unwritten portion of an open block by performing a word line by word line binary search of a first physical area of the block to identify a last written word line in the first physical area of the block and subsequently searching one or more word lines in at least a second physical area of the block corresponding to the last written word line in the first physical area of the block.

2. The system of claim 1 wherein the block is a three dimensional block that is monolithically formed in two or more physical levels of arrays of memory cells having an active area disposed above a silicon substrate, the open block including separately selectable sets of vertical NAND strings, NAND strings of different sets connected by common bit lines, wherein the first physical area is a first set of strings and the second physical area is a second set of strings.

3. The system of claim 2 wherein the at least the second physical area includes a third set of strings and a fourth set of strings and wherein the block search circuit is configured to search for the boundary in the at least the second physical area by searching word lines of the second, third, and/or fourth sets of strings that correspond to the last written word line of the first set of strings.

4. The system of claim 3 wherein the plurality of open blocks store data in Multi Level Cell (MLC) format and wherein the block search circuit is configured to perform the binary search of the first set of strings and the subsequent searching for the boundary in the second, third, and/or fourth sets of strings by detecting lower page data only.

5. The system of claim 2 further comprising: a programming circuit that is configured to program data in the open block in a predetermined sequence and, when programming data in a physical level, is configured to program a word line of the first set of strings before any word line of any other set of strings in the physical level.

6. The system of claim 1 wherein the open block is a metablock that extends across two or more planes, the first physical area is in a first plane and the second physical area is in a second plane.

7. The system of claim 6 wherein the block is a Multi Level Cell (MLC) block that stores at least lower page data and upper page data along a word line and wherein the block search circuit is configured to limit the word line by word line binary search to lower page data.

8. The system of claim 7 wherein the block search circuit is configured to search for the boundary in the at least the second physical area in a lower page search phase followed by an upper page search phase.

9. The system of claim 8 further comprising:
a write circuit that is configured to write data to fill open blocks; and
a table that records filled block locations in a block of memory cells in the nonvolatile memory system.

10. A system comprising:
a memory containing a plurality of blocks of memory cells including one or more open blocks, each open block having a written portion and an unwritten portion; and
a memory controller containing a block search circuit configured to search for the one or more open blocks and to further search for a boundary between the written portion and the unwritten portion of an open block by performing a word line by word line binary search of a first separately selectable set of NAND strings of the block to identify a last written word line in the first separately selectable set of NAND strings and subsequently search a word line in at least a second separately selectable set of NAND strings of the block corresponding to the last written word line in the first separately selectable set of NAND strings.

11. The system of claim 10 wherein the open block contains four or more separately selectable sets of NAND strings and the block search circuit is configured to perform a binary search of word lines of the four or more separately selectable sets of NAND strings that correspond to the last written word line of the first set of strings.

12. The system of claim 11 wherein the open block stores data in Multi Level Cell (MLC) format and wherein the block search circuit is configured to perform the binary search of the first separately selectable set of NAND strings and the binary search of word lines of the four or more separately selectable sets of NAND strings strings by detecting lower page data only.

13. The system of claim 10 further comprising:
one or more closed blocks in the memory; and
a table that records locations of the one or more closed blocks, the table stored in the nonvolatile memory.

14. The system of claim 13 wherein the block search circuit is configured to search for the one or more open blocks by reading a first word line of each block that is not recorded in the table.

15. The system of claim 10 wherein the block search circuit is configured to search for the one or more open blocks and to further search for a boundary between the written portion and the unwritten portion of the open block in response to receiving power after a time without power.

16. A system comprising:
a plurality of blocks of memory cells arranged in planes, each plane having dedicated read/write circuits, blocks of different planes linked to form metablocks that are configured for parallel access; and
a block search circuit configured to search for a boundary between a written portion and an unwritten portion of an open metablock by performing a word line by word line binary search of a first block of the open metablock, the first block located in a first plane, to identify a last written word line in the first block and subsequently search a word line located in at least a second block of the open metablock at a location corresponding to the last written word line in the first block of the open metablock.

17. The system of claim 16 wherein the open metablock stores data in Multi Level Cell (MLC) format and wherein the block search circuit is configured to perform the binary search of the first block of the open metablock and the search of the corresponding word line in at least the second block of the open metablock by detecting lower page data only.

18. The system of claim 16 further comprising: a programming circuit configured to program data on all blocks of the open metablock in parallel, the programming circuit configured start with a first word line of all blocks of the open metablock.

19. The system of claim 18 wherein the block search circuit is further configured to search for open metablocks by reading the first word line of at least one block of a metablock identified as possibly open.

20. The system of claim 19 further comprising:
a table stored in the plurality of blocks that records closed metablock locations, the block search circuit configured to search for open metablocks by reading the first word line of at least one block of every metablock that is not recorded in the table.

* * * * *